US009076837B2

(12) United States Patent
Lin et al.

(10) Patent No.: US 9,076,837 B2
(45) Date of Patent: Jul. 7, 2015

(54) LATERAL INSULATED GATE BIPOLAR TRANSISTOR STRUCTURE WITH LOW PARASITIC BJT GAIN AND STABLE THRESHOLD VOLTAGE

(75) Inventors: Long-Shih Lin, Zhubei (TW); Kun-Ming Huang, Taipei (TW); Ming-Yi Lin, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/543,662

(22) Filed: Jul. 6, 2012

(65) Prior Publication Data

US 2014/0008723 A1    Jan. 9, 2014

(51) Int. Cl.
*H01L 29/49* (2006.01)
*H01L 29/739* (2006.01)
*H01L 29/66* (2006.01)
*H01L 29/06* (2006.01)
*H01L 29/08* (2006.01)
*H01L 29/10* (2006.01)
*H01L 29/423* (2006.01)

(52) U.S. Cl.
CPC ...... *H01L 29/7394* (2013.01); *H01L 29/66325* (2013.01); *H01L 29/42368* (2013.01); *H01L 29/0634* (2013.01); *H01L 29/0696* (2013.01); *H01L 29/0847* (2013.01); *H01L 29/1095* (2013.01)

(58) Field of Classification Search
CPC ............... H01L 29/1095; H01L 29/42368; H01L 29/0696
USPC ......... 257/491, 492, 493, 409, 454, 327, 141, 257/139, 328, E29.197, E21.382
See application file for complete search history.

(56) References Cited

U.S. PATENT DOCUMENTS

| | | | | |
|---|---|---|---|---|
| 6,424,005 B1* | 7/2002 | Tsai et al. | | 257/335 |
| 7,265,416 B2* | 9/2007 | Choi et al. | | 257/343 |
| 7,605,040 B2* | 10/2009 | Choi et al. | | 438/286 |
| 7,989,890 B2* | 8/2011 | Huang et al. | | 257/343 |
| 7,999,317 B2* | 8/2011 | Lu et al. | | 257/342 |
| 8,188,511 B2* | 5/2012 | Iwamuro | | 257/141 |
| 8,377,755 B2* | 2/2013 | Cheng et al. | | 438/135 |
| 8,389,341 B2* | 3/2013 | Huang et al. | | 438/140 |
| 8,482,031 B2* | 7/2013 | Udrea et al. | | 257/141 |
| 2002/0005559 A1* | 1/2002 | Suzuki | | 257/492 |
| 2006/0118902 A1* | 6/2006 | Ikuta et al. | | 257/491 |

* cited by examiner

*Primary Examiner* — Michael Shingleton
(74) *Attorney, Agent, or Firm* — Lowe Hauptman & Ham, LLP

(57) ABSTRACT

A metal-oxide-semiconductor laterally diffused device (HV LDMOS), particularly a lateral insulated gate bipolar junction transistor (LIGBT), and a method of making it are provided in this disclosure. The device includes a silicon-on-insulator (SOI) substrate having a drift region, two oppositely doped well regions in the drift region, two insulating structures over and embedded in the drift region and second well region, a gate structure, and a source region in the second well region over a third well region embedded in the second well region. The third well region is disposed between the gate structure and the second insulating structure.

20 Claims, 14 Drawing Sheets

US 9,076,837 B2

LATERAL INSULATED GATE BIPOLAR TRANSISTOR STRUCTURE WITH LOW PARASITIC BJT GAIN AND STABLE THRESHOLD VOLTAGE

FIELD

The present disclosure relates generally to semiconductor technology, and more particularly, to high voltage semiconductor devices and methods of making the same.

BACKGROUND

Technological advances in semiconductor integrated circuit (IC) materials, design, processing, and manufacturing have enabled ever-shrinking IC devices, where each generation has smaller and more complex circuits than the previous generation.

As semiconductor circuits composed of devices such as metal-oxide-semiconductor field effect transistors (MOSFETs) are adapted for high voltage applications, such as high voltage lateral diffusion metal-oxide-semiconductor devices (HV LDMOSs) including a type of HV LDMOS known as high voltage lateral insulated gate bipolar transistors (HV LIGBTs), problems arise with respect to varying threshold voltage. MOS fabrication process flows may include multiple high concentration implantations. Unfortunately, the multiple implantations also reduce gains of parasitic BJT that can latch-up and affect device performance. A parasitic BJT is a part of the LIGBT that allows a high current to flow when the transistor is turned on. When the LIGBT is on, the electrons flow through the channel of the LIGBT and holes flow through the parasitic BJT at the same time. Thus, a low-impedance path is formed in the parasitic BJT to allow a high current for the LIGBT. Unwanted resistance in the parasitic BJT can cause the LIGBT to overheat.

For a normally operating LIGBT, the parasitic BJT turns off when the LIGBT is off. An internal latch-up circuit for the LIGBT refers to the condition when the parasitic BJT continues to flow even when the LIGBT is off. The continued hole current can damage the transistor and cause a product to fail. While various methods including use of a deep p-type well has been developed to reduce parasitic BJT gain and reduce the impedance in the parasitic BJT path, a HV LIGBT devices having a low parasitic BJT gain and an uniform threshold voltage and a method for making the same continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

Figure 1A:
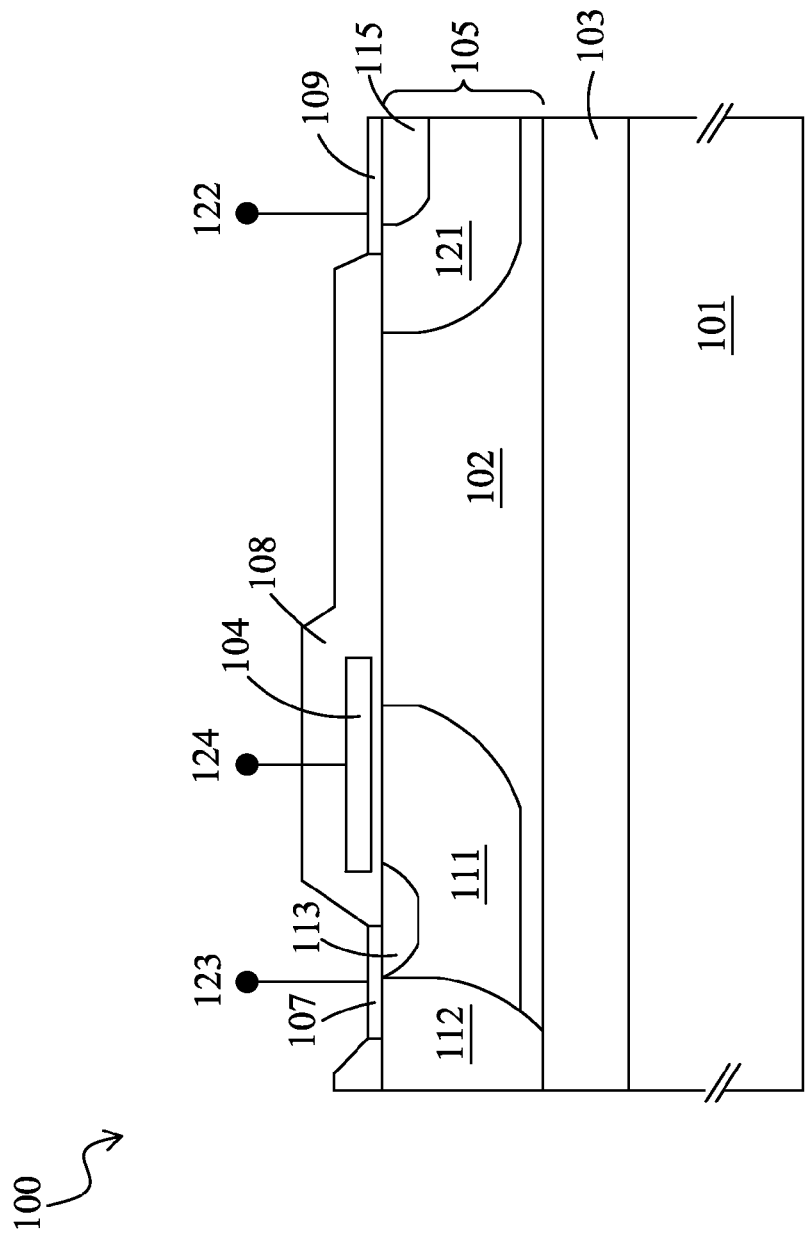
FIGS. 1A and 1B are cross-sectional views of two different HV LIGBT transistor devices.

Various embodiments will be explained in detail with reference to the accompanying drawings.

DETAILED DESCRIPTION

It is understood that the following disclosure provides many different embodiments, or examples, for implementing different features of the invention. Specific examples of components and arrangements are described below to simplify the present disclosure. These are, of course, examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Spatially relative terms, such as "below," "lower," "above," "upper", "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

In various embodiments, HV LIGBT transistors with uniform threshold voltage (Vt) and low-impedance path for the parasitic BJT and a method of fabricating such devices are illustrated.

FIG. 1A is a cross-sectional view of an HV LIGBT transistor. In FIG. 1A, an n-type HV MOS device 100 is fabricated in a silicon-on insulator (SOI) substrate having a p-type substrate 101, insulator layer 103, and silicon layer 105. A n-drift region 102 is formed in silicon layer 105. A field oxide 108 is formed over the n-drift region 102 and a gate 104 is formed in and over a portion of the filed oxide 108. A source 107 and a drain 109 are formed on opposite sides of the gate 104. The source region includes a pair of oppositely doped regions p+(112) and n+(113) contained in a p-well 111. Source terminal 123 is electrically connected to the doped regions 112 and 113. At an edge of field oxide 108, n-type doped well 121 is formed in n-drift region 102 and a p+ doped region 115 and electrically connected to a drain terminal 122 through the drain 109. Because the HV transistor is subjected to a higher operation voltage and a higher operation current compared with other transistors in the same integrated circuit, any substrate leakage can cause significant interference with normal operation of other transistors. The use of an SOI substrate allows complete isolation of the HV transistor from other transistors in the semiconductor device. The HV transistor 100 can suffer some of the issues associated with the parasitic BJT (p-n-p of 115/102/111) as described.

Figure 1B:
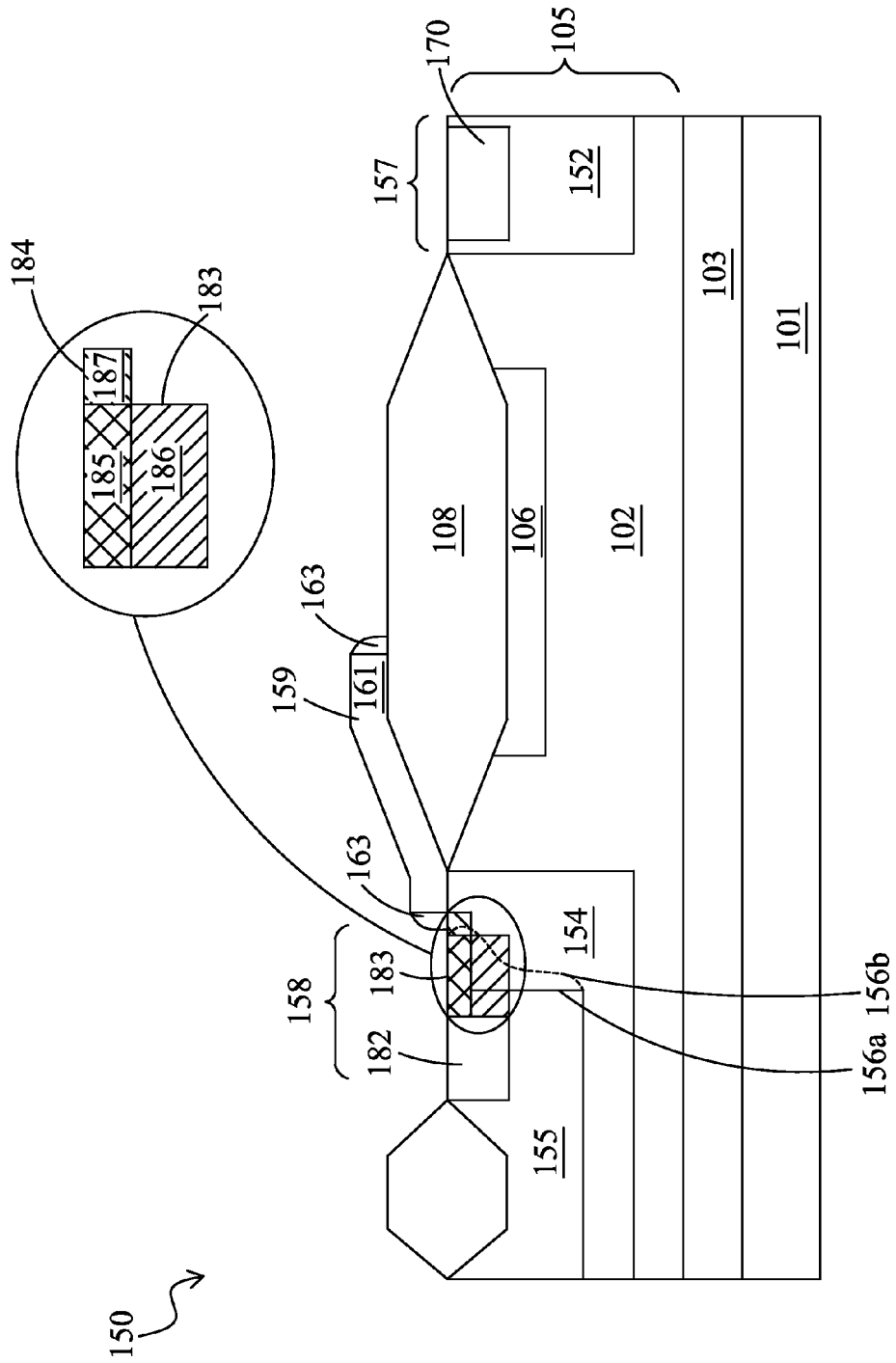

FIG. 1B is a cross-sectional view of an HV LIGBT device 150 known to the Applicants. Compared with the device 100 in FIG. 1A, device 150 has a p-ring layer 106 under the field oxide 108. In FIG. 1B, an n-type HV LIGBT device 150 is fabricated on an SOI substrate having a p-type substrate 101, insulator layer 103, and silicon layer 105. An n-drift region 102 is formed in the silicon layer 105. The n-type doping in the silicon layer forming the n-drift region 102 may be provided as part of the SOI substrate or be subsequently doped in a separate process. A field oxide 108 is formed on and partially embedded in the n-drift region 102 directly over the p-ring layer 106. On one side of the field oxide 108 is a drain region 157 that includes a p doped drain region 170 formed in n-well 152. On the other side of the field oxide is a p-well 154 in the n-drift region 102. A gate structure 159 partly overlies the field oxide 108 and the p-well 154. The gate structure includes a gate stack 161 and gate spacers 163 on both sides of the gate stack 161. The gate stack 161 includes a gate dielectric and gate electrode, which may be made of polysilicon or metals.

A source region 158 is disposed in the p-well 154 next to the gate structure 159. The source region 158 includes a p-type region 182 and a n-type region 183, both contained in the p-well 154. A lightly doped source (LDS) region 184 is formed first by doping an n-type dopant before the gate spacer 163 is deposited. After the gate spacer is deposited, another n-type region 183 is implanted. As shown in the expanded view, a portion of the LDS 184 is additionally implanted when the n-type region 183 is formed, separating the LDS 184 into a lightly doped region 187 under the gate spacer 163 and a higher doped region 185 in the source region 158. The n-type region 183 may also include two regions 185 and 186. Region 185 overlaps the LDS 184. The n-type dopant concentration of the n-type region 183 electrically overcomes the deep p-well 155 p-type concentration.

A deep p-well (DPW) 155 is formed in the p-well 154 before forming the field oxides and the source region. The DPW 155 reduces impedance for hole current in the parasitic BJT by increasing the p-type doping in the p-well 154 portion of the hole path, which starts from the p-doped drain region 170 to n-drift region 102 and then to p-well 154. However, care must be taken to ensure that p-type dopant concentration does not increase in the channel region under the gate structure. The solid line 156a denotes the boundary of DPW 155 as implanted. However, after the subsequent field oxide and gate dielectric formation where very high temperatures are used, the boundary of the DPW 155 shifts because the higher concentration region DPW 155 dopants diffuse to lower concentration regions p-well 154 as shown by the dashed lines 156b. As result p-type dopant concentration around the gate edge may increase, especially in the LDS region 187 under the gate spacer, and increase the threshold voltage for the device as result of the diffusion. The rate of diffusion may differ from wafer to wafer and locations on the wafer due to slightly different temperatures experienced during oxide formation. Thus the effect to the threshold voltage is also not uniform from device to device. While moving the DPW 155 away from the gate or decreasing the dopant concentration in the DPW 155 can reduce the variation of threshold voltage among different LDMOS devices 150, the hole impedance in the hole current path would correspondingly increase, which increases the likelihood of a latchup-type device failure.

The present disclosure discloses an HV LDMOS transistor, particularly an LIGBT with relatively uniform threshold voltage (Vt) and lower impedance path for the parasitic BJT than the transistors of FIGS. 1A and 1B. The HV LIGBT of the present disclosure has a reduced hole impedance in the hole carrier path by increasing the p-type dopant concentration in the path.

The HV LIGBT also improves the threshold voltage uniformity by increasing the n-type dopant concentration in the vicinity of the gate edge that reduces the likelihood of the p-type dopant diffusion into the channel region under the gate structure. In some embodiments, the method avoids having to use additional photo masks to accomplish the low-impedance path and the higher n-type dopant area under a portion of the gate structure. The low impedance path is accomplished by implanting a p-well similar to the DPW of FIG. 1B but closer to the gate after the field oxide and gate dielectric formation. The likelihood of p-type dopant diffusion is greatly reduced because the partially fabricated device would not be subjected to very high temperatures since the thermal oxide features are already formed. The higher p-type dopant concentration in the hole carrier path improves impedance and reduces the likelihood of latch-up type failure. The non-uniform threshold voltage is addressed by increasing the dopant concentration during the LDS formation or by an additional angled implantation of n-type dopants under the gate spacer.

Figure 2A:
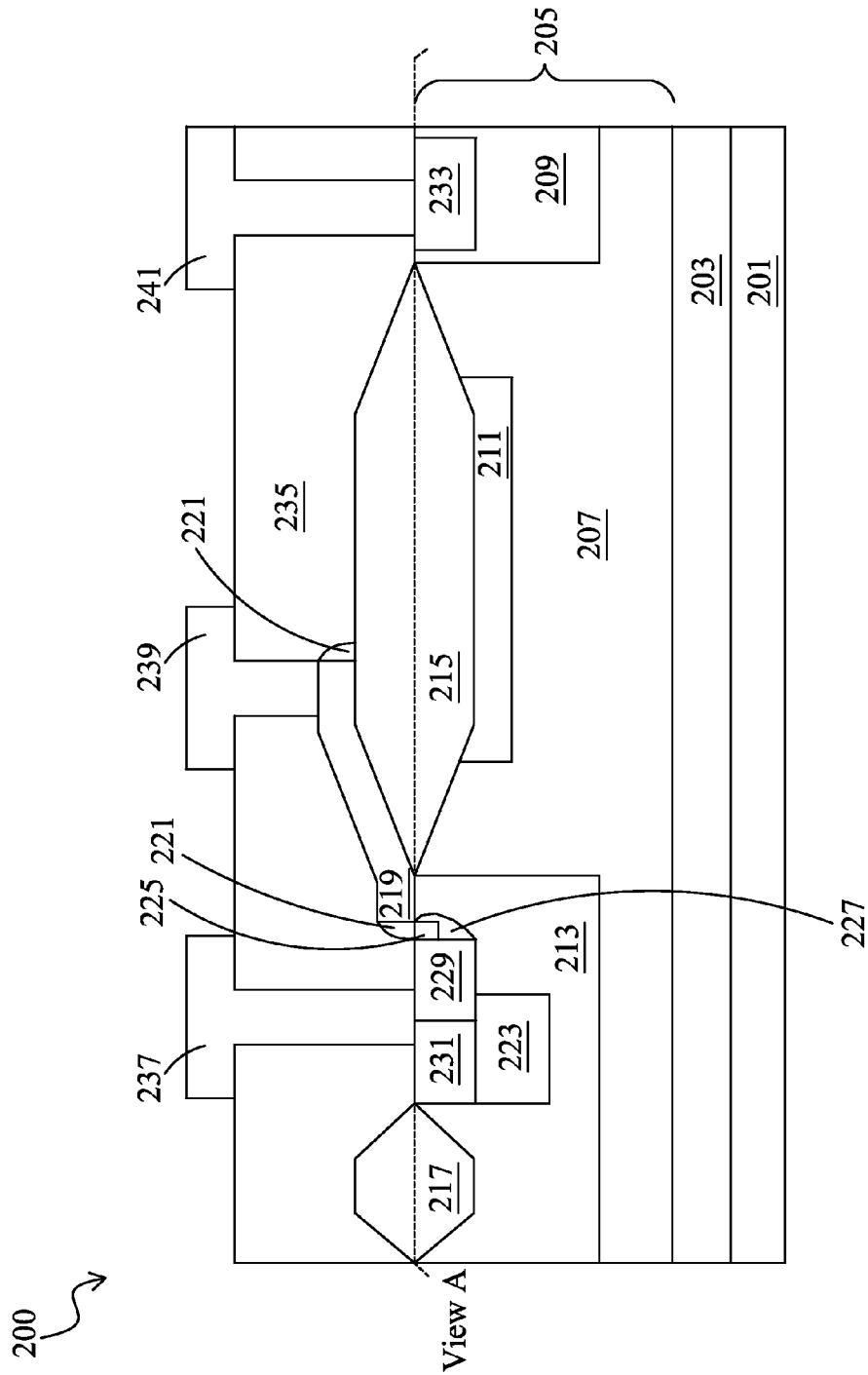
FIG. 2A is a cross-sectional view of a HV LIGBT transistor according to various embodiments of the present disclosure.

FIG. 2A shows a cross-sectional view of a HV LIGBT 200 according to various embodiments of the present disclosure. The HV LIGBT of FIG. 2A includes a lower impedance path for the parasitic BJT, for example, p-n-p (233/207/213), and can be made with good uniformity as to the threshold voltage. In the present embodiments, the HV LIGBT 200 is an n-type HV LIGBT, and thus, the SOI substrate includes a p-type silicon substrate (p-substrate) 201, an insulator layer 203, and a silicon layer 205. Alternatively, the SOI substrate may include other elementary semiconductors, such as germanium. The substrate may also include a compound semiconductor, such as silicon carbide, gallium arsenic, indium arsenide, and indium phosphide. The substrate may include an alloy semiconductor, such as silicon germanium, silicon germanium carbide, gallium arsenic phosphide, and gallium indium phosphide.

A drift region 207 is formed over the insulating layer 203, the drift region 207 having a different type of conductivity from the underlying substrate 201, which is p-type. For example, the substrate 201 has p-type conductivity and the drift region 207 has n-type conductivity. In the present embodiments, the drift region 207 is an N-Drift (n-well) over the insulator layer 203. The n-drift region 207 may be provided with the SOI substrate or be later doped with an n-type dopant such as phosphorus.

Field insulating layers 215 separates the gate and the drain structures. A field insulating layer 215, which may be a field oxide, is formed on and partially embedded in the n-drift region 207 directly over the p-ring layer 211. On one side of the field oxide 215 is a drain region (233 and 209) that includes a p+ doped drain region 233 formed in an n-well 209. On the other side of the field oxide 215 is a p-well 213 in the n-drift region 207. A gate structure partly overlies the field oxide 215 and the p-well 213. The gate structure includes a gate stack 219 and gate spacers 221 on both sides of the gate stack 219. The gate stack 219 includes a gate dielectric and gate electrode, which may be made of polysilicon or metals.

A source region is disposed in the p-well 213 next to the gate structure. The source region includes a p-type region p+(231) and a n-type region N+(229), both contained in the p-well 213. A lightly doped source (LDS) region 225 is formed first by doping an n-type dopant before the gate spacer 221 is deposited. After the gate spacer is deposited, an n-type region 227 is implanted under the spacer at an angle.

Another p-well 223 is formed in the p-well 213 after the field oxides 215 and 217 and the gate spacer 221 are formed. The p-well 223 is a low impedance area that reduces impedance for hole current in the parasitic BJT by increasing the p-type doping in the p-well 223 portion of the BJT hole path. It is implanted into the p-well 213 at a normal angle and aligned with the field oxide 217 and gate spacer 221. Because the p-type dopant diffusion issues are reduced or eliminated by forming the p-well 223 after the field oxide formation, the p-well 223 can be implanted closer to the gate than the DPW of FIG. 1B. The closer implantation increases the p-type dopant concentration in the hole current path and reduces impedance relative to the structure of FIG. 1B. Further, the n-type region 227 implanted under the gate spacer further neutralizes any p-type dopants in that vicinity to reduce any effect on the threshold voltage.

Figure 2B:
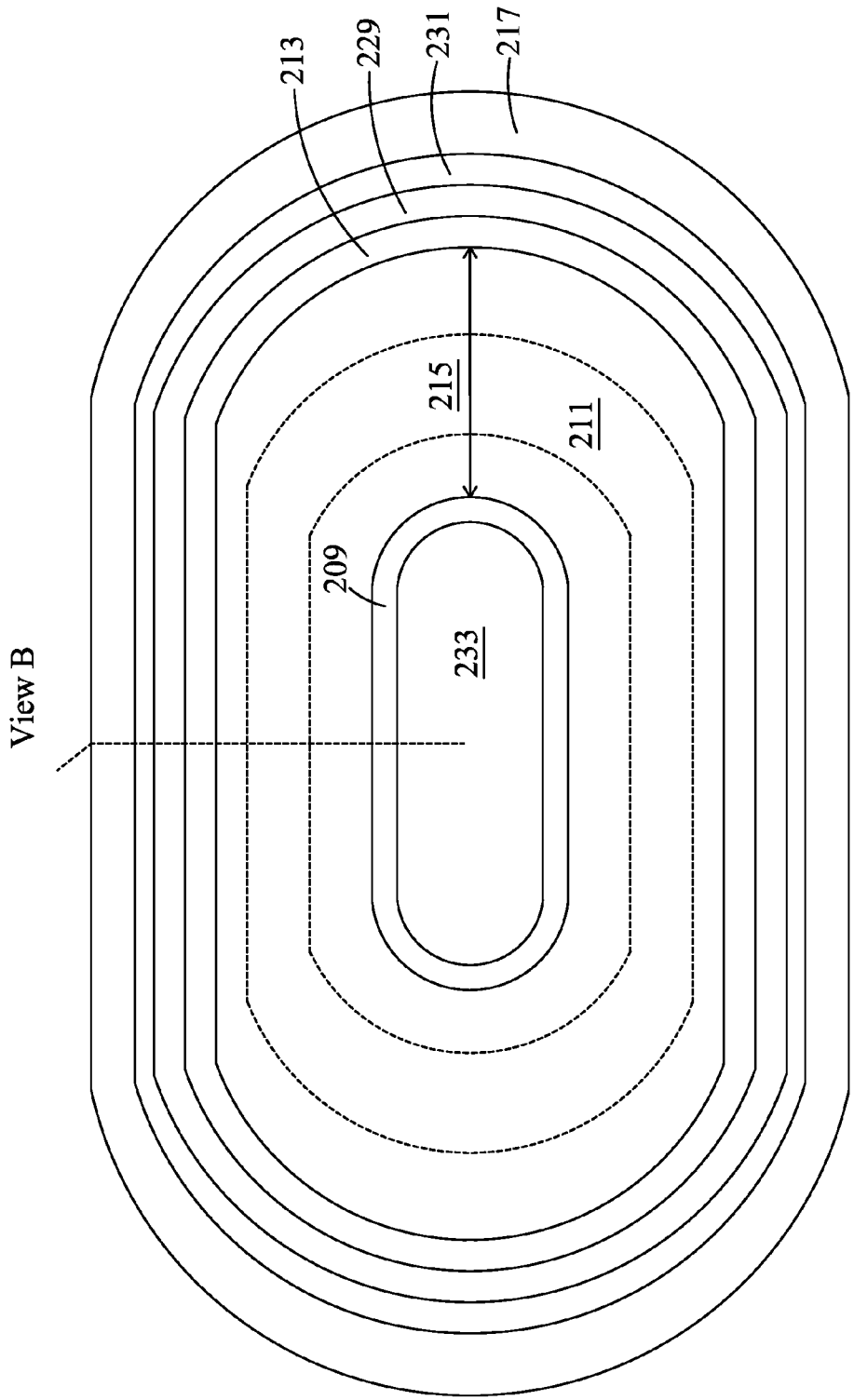
FIG. 2B is a sectional top view of HV LIGBT transistors according to different embodiments of the present disclosure.

FIG. 2B shows sectional top views of embodiments of the cross section of HV LIGBT of FIG. 2A. FIG. 2B shows an embodiment where the HV LIGBT has an oval-shaped, an embodiment of which is a circular-shaped. FIG. 2A is a cross-sectional view taken from a reference plane identified as "view B" in FIG. 2B. Meanwhile, FIG. 2B is a cross-sectional view taken from a reference plane identified as "view A" in FIG. 2A.

FIGS. 2A and 2B are labeled with same element numbers for the same element for ease of reference. Starting at a center of the oval top view, the drain p+ portion 233 is the smallest oval. A small portion of exposed n-well 209 surrounds the drain p+ portion 233. The drain p+ portion 233 and exposed n-well 209 together may be considered the drain region. First field oxide 215 is the oval donut with solid lines surrounding the drain region. Under the first field oxide 215 is the p-ring 211, with edges of the p-ring shown in dotted lines. Note that only selected transistor elements from FIG. 2A are reflected in FIG. 2B because many elements are under the sectional View A cut. Going radially outward, the next oval donut is an exposed portion of the p-well 213, and then the n+ source region 229, followed by the p+ source region 231. The outermost oval donut shows field oxide 217. Note that the n-drift region 207 is disposed below the entire overview as shown. However, in some embodiments, small portion may be exposed. For example, a small portion of the n-drift region around the field oxide 215 may be exposed in some embodiments. The transistor 200 allows a drain pad to be located toward a center of the oval structure to maximize breakdown voltage. The oval shape has fairly straight long edges as opposed to the ellipse which continuously curve. The oval shape can be defined to utilize more of the corner areas and reduce the non-use at corners of the rectangular sections on an IC chip. Depending on the size of transistor required, the long edges may be increased or reduced as needed. In some embodiments, the curved sections of the oval may be a portion of an ellipse. In still other embodiments, the donuts may be ellipses or other conical sections such as a parabola.

Figure 3A:
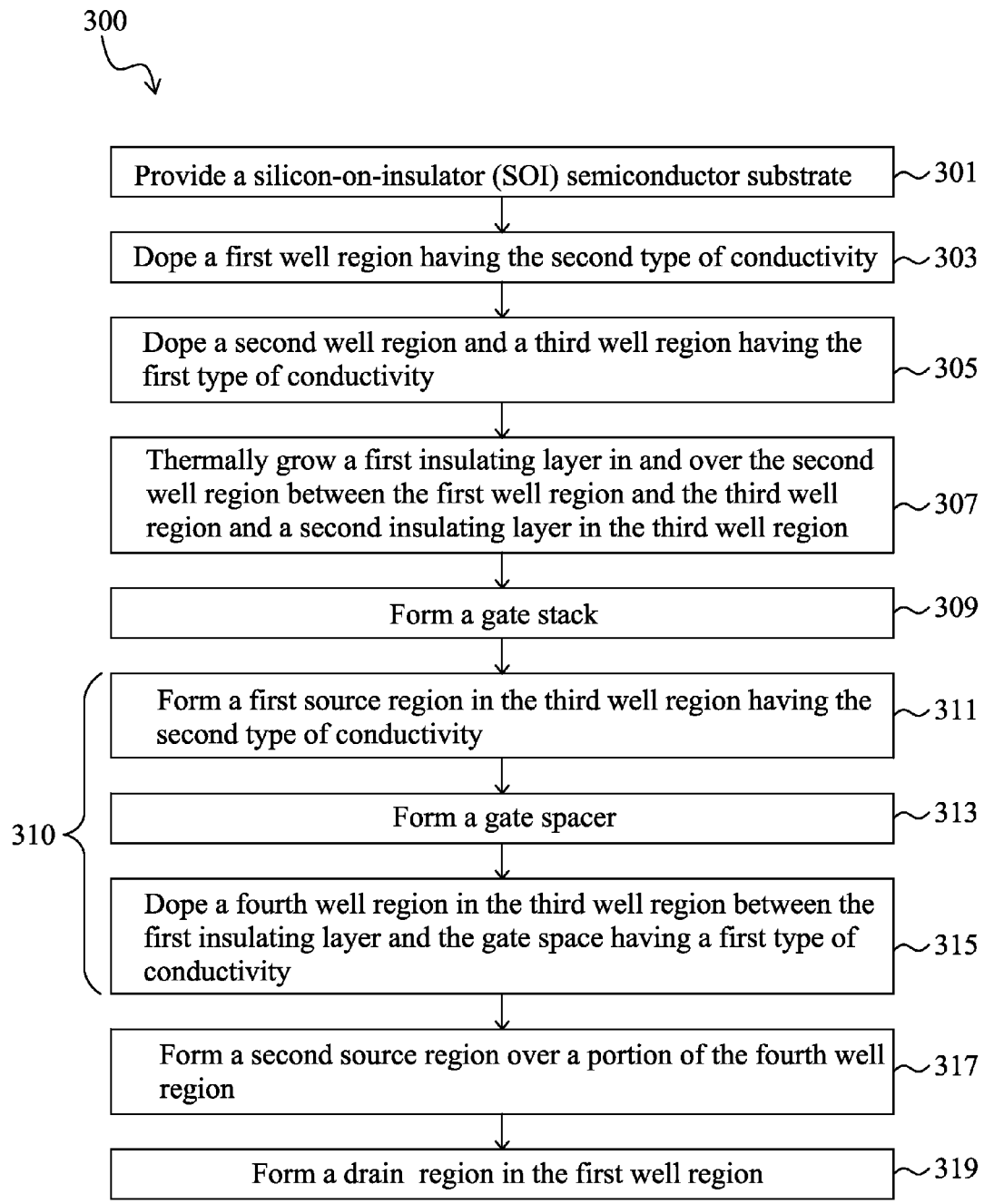
FIGS. 3A and 3B are flow charts of methods for fabricating a HV LIGBT device according to various aspects of the present disclosure.
Figure 3B:
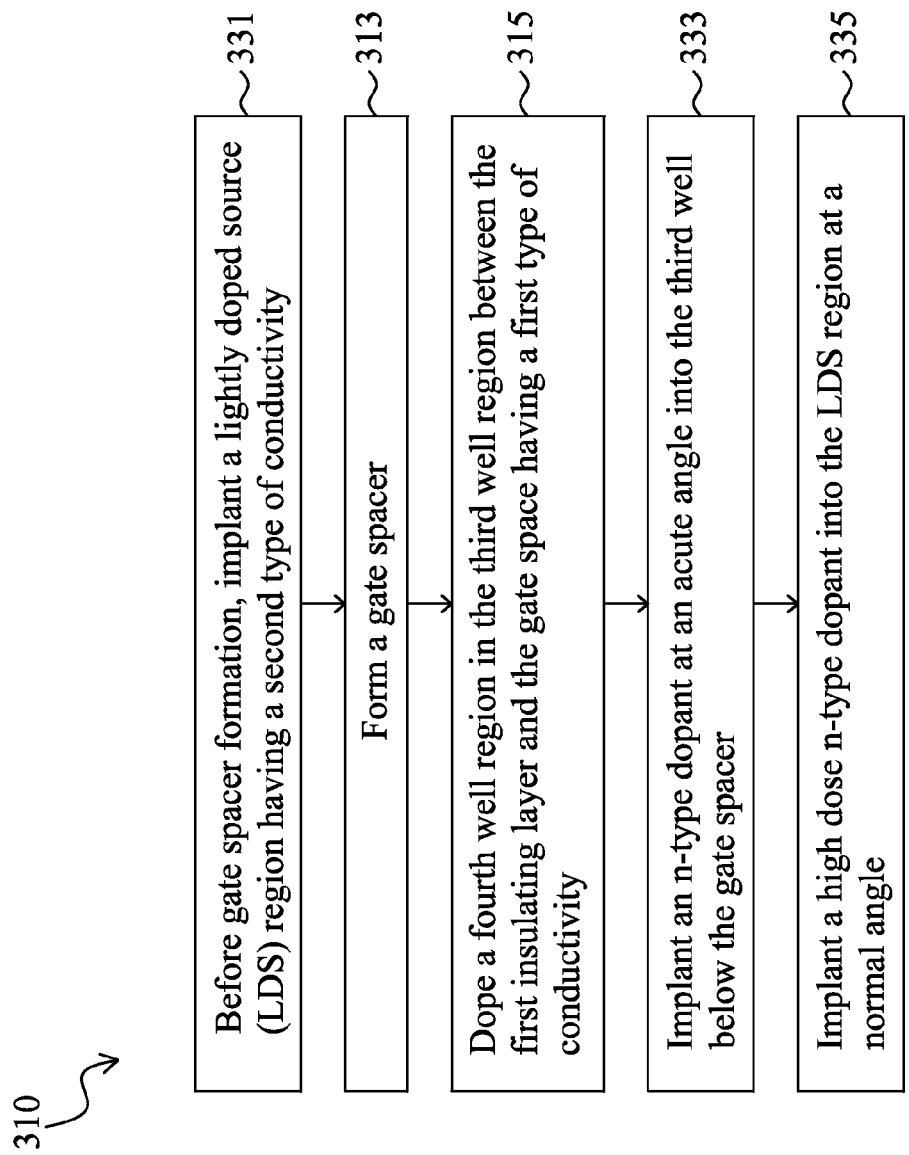

FIGS. 3A and 3B are flowcharts of a method 300 for fabricating a high voltage laterally diffused MOS semiconductor device, according to various aspects of the present disclosure. It should be noted that the method 300 may be implemented in a complementary metal oxide semiconductor (CMOS) technology process flow. Accordingly, it is understood that additional processes may be provided before, during, and after the method 300, and some processes may only be briefly described herein. FIG. 3B shows a portion of the method 300 according some embodiments of the present disclosure.

Figure 4A:
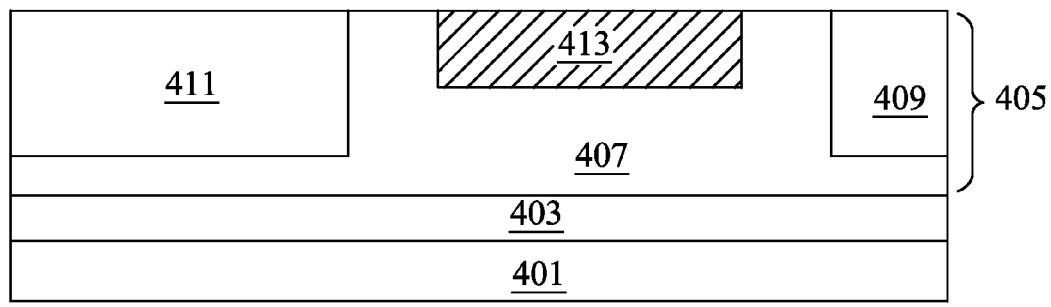
FIGS. 4A to 4I are cross section views of a HV LIGBT device embodiment of the present disclosure in various manufacturing stages according to one or more embodiments of the present disclosure.

The method 300 begins with block 301 in which an SOI semiconductor substrate is provided. For example, as shown in FIG. 4A, the SOI substrate having a first conductivity type (p-type) substrate 401, insulator layer 403, and silicon layer 405 having a second conductivity type (n-type) is provided. The SOI substrate may be hereinafter referred to as the workpiece. The n-type region of the silicon layer 405 is the drift region 407, referred to also as the n-drift region 407. In block 303, a first well region having the second type of conductivity (n-type) is doped. For example, in FIG. 4A, the first well region 409 is formed in the silicon layer 405. The doping may be implantation using n-type dopants such as phosphorus. The n-well 409 has a higher dopant concentration than the n-drift region 407. In some embodiments, the difference in the dopant concentration may be an order of magnitude or greater.

In block 303, a second well region and a third well region having the first type of conductivity is doped. The second well region and the third well region have different dopant concentrations and may be doped sequentially or partially together. In some embodiments, the second well region and the third well region are implanted separately with a p-type dopant such as boron using different concentrations and implant energies. In other embodiments, the third well region is implanted twice—the first time with the second well region and the second time by itself to result in a higher dopant concentration in the third well region than in the second well region. In FIG. 4A, the second well region is identified by reference numeral 413 and the third well region is identified by reference numeral 411. The second well region is placed between the first well region 409 and the third well region 411 with exposed portions of n-drift region 407 between the well regions. The first, second, and third well regions need not be implanted in any particular order. The first well region 409 may be formed last and the third well region 411 may be formed before the second well region 413.

Figure 4B:
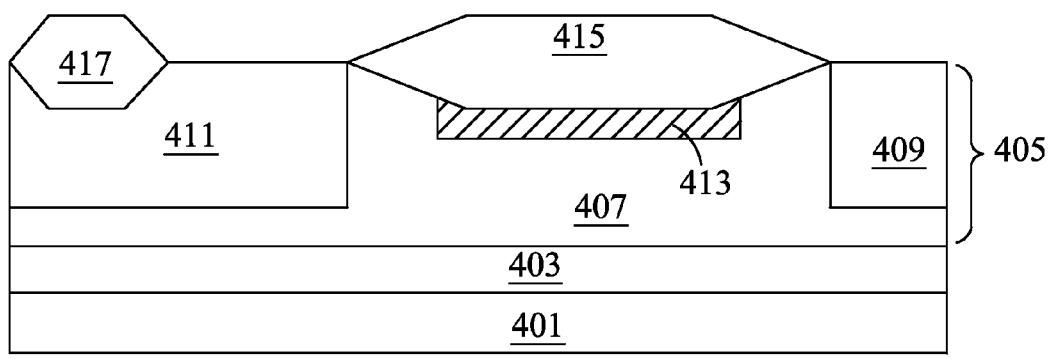

The method 300 continues with block 307, in which one or more insulating layers, also referred to as a field oxide, are formed on the workpiece. The insulating layers may include a dielectric, such as silicon oxide, nitride, or other suitable insulating materials. FIG. 4B shows a first field oxide 415 formed over and in the second well region 413 that is surrounded by drift region 407 and a second field oxide 417 formed over the third well region 411. The field oxides 415 and 417 may be formed by a thermal oxide process. The workpiece is patterned to protect regions where the field oxide is undesirable. Then, the workpiece is subjected to a high temperature, for example, about 800 degrees Celsius or greater, in the presence of oxygen and optionally water. In some embodiments, the presence of water speeds the oxide formation process. While FIG. 4B shows that the edge of field oxide 415 borders the edge of third well 411, the edges do not need to be aligned. In some embodiments, a small portion of n-drift region 407 may be disposed between the field oxide 415 and third well 411.

Figure 4C:
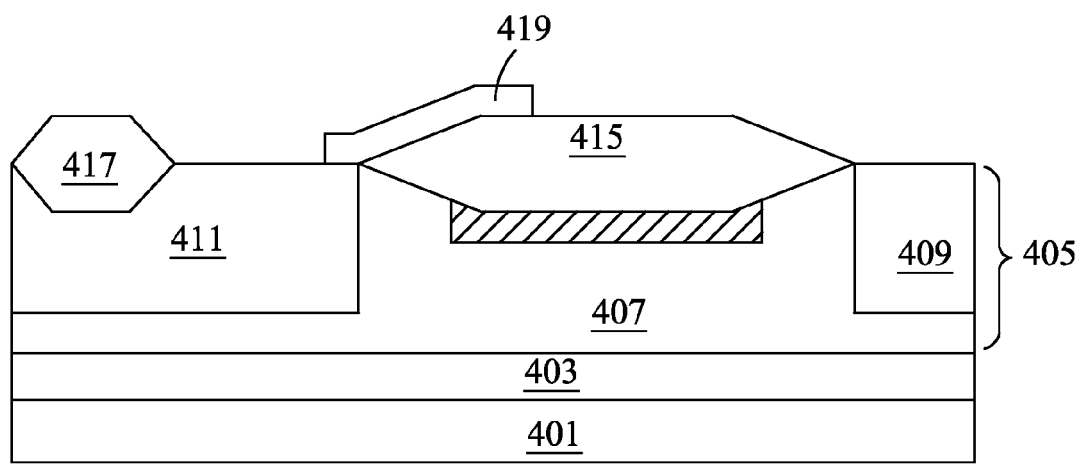

Referring back to FIG. 3A, in operation 309, a gate stack is built over the workpiece. As shown in FIG. 4C, the gate 419 overlies two or three areas: a first part of the gate stack 419 overlies the edge of the insulating layer 415, a second part of the gate stack overlies the top surface of the third well 411, and optionally a third part of the gate stack overlies a portion of the drift region 407 between the third well 411 and field oxide 415. The gate stack 419 includes a lower dielectric layer (gate dielectric) and an upper electrode layer (gate electrode).

The gate electrode may be polysilicon or metal. The overlay of the gate structure 419 over the insulating layer 415, the third well 411, and/or the drift region 407 is achieved by a process including photolithography patterning and etching. One exemplary method for patterning the gate dielectric and electrode layers over the insulating layer 415, the third well 411, and/or the drift region 407 is described below. A dielectric layer and an electrode layer are first deposited using known processes. A layer of photoresist is formed on the electrode layer by a suitable process, such as spin-on coating, and then patterned to form a patterned photoresist feature by a lithography patterning method. The pattern of the photoresist can then be transferred by a dry etching process to the underlying electrode layer and the dielectric layer to form gate electrodes and gate dielectric, in a plurality of processing steps and various proper sequences. The overlay of the gate structure over the field oxide 415 and the third well 411 is controlled by the lithographic alignment procedure. The photoresist layer is stripped thereafter.

Figure 4D:
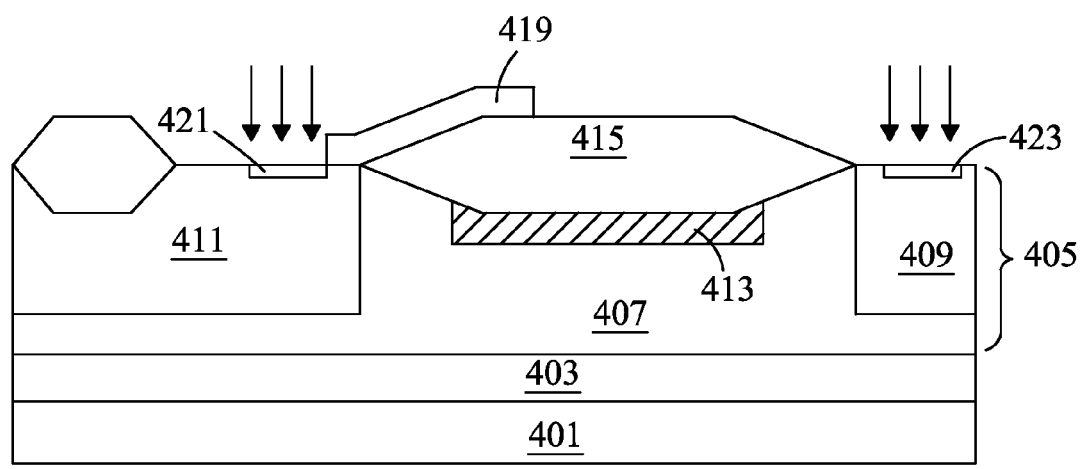

Referring to FIG. 3A, in block 311a first source region having a second type of conductivity is formed in the third well. In some embodiments of blocks 311 to 315, this first source region includes two portions, a first portion that is partially under a gate spacer and a highly doped second portion aligned with the gate spacer. The first portion is implanted before a gate spacer is formed around the gate stack and aligned with the gate stack. This first portion is has a higher dopant concentration than a lightly doped drain (LDD) region in a low voltage transistor region on the SOI substrate. For example, other, non-HV, transistors on the semiconductor device includes LDD or lightly doped source (LDS) regions that have a lower dopant concentration than the first portion of the first source region. This may be accomplished by using a different photomask from the LDD/LDS mask to implant this first portion. FIG. 4D shows a first portion 421 implanted adjacent to the gate stack. Another doped region 423 in the drain region may or may not occur at the same time.

Figure 4E:
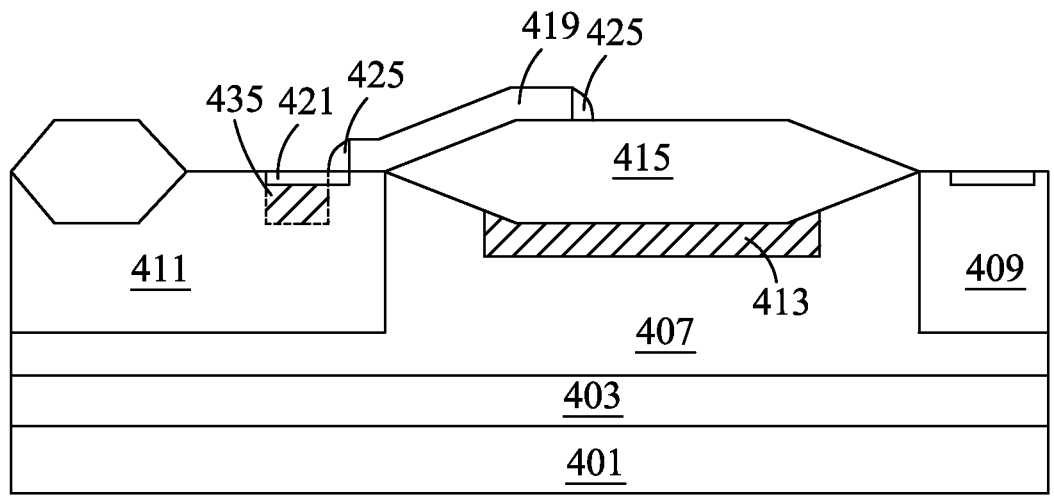

The second portion is also referred to as the N+ portion of the source region. A gate spacer is formed in block 313 of method 300 before the second portion is implanted. The gate spacer may be silicon nitride or other commonly used dielectric material. FIG. 4E shows the gate spacers 425 around the gate stack 419. The gate spacers 425 and the gate stack 419 together form the gate structure. Using the gate spacer 425 and the photomask from the first portion as the boundaries, the N+ implantation forms a second portion of the first source region without using an additional photomask. This second portion has a higher dopant concentration as compared to the first portion 421 and is shown in dotted lines as region 435 in FIG. 4E.

Figure 4F:
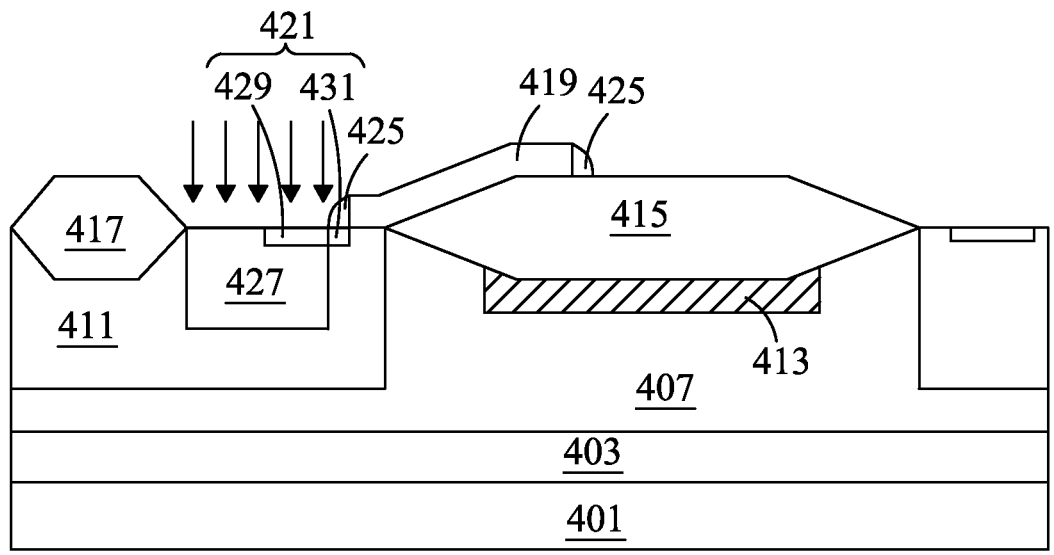

Referring to FIG. 3A, in block 315, a fourth well region having a first type of conductivity (p-type) is formed in the third well region between the first insulating layer and the gate spacers 425. The fourth well is formed by implanting a p-type dopant such as boron into the third well. FIG. 4F shows the fourth well 427 that is aligned with the gate spacer 425 and the field oxide 417. The boron is implanted at a concentration greater than about $2E14/cm^3$ or greater than about $8E14/cm^3$. The first source region as shown includes two sections, a section 431 under the gate spacer and a section 429 aligned with the gate spacer in the fourth well 427. The fourth well has a higher dopant concentration than the third well. Electrically, the p-type dopant in the fourth well does not overcome the N+ dopant in the first source region so that area 429 as shown in FIG. 4F still has an n-type conductivity. However, the fourth well region is implanted using a higher energy level so as to penetrate deeper into the third well where a hole current path may be during transistor operation. Thus a higher p-type dopant concentration is achieved closer to the gate edge to provide a low-impedance path for the hole current.

Blocks 311 to 315 are referred together as steps 310. Other embodiments of steps 310 are shown in FIG. 3B. The operations of FIG. 3B eliminate the need for an additional photomask while using the same number of process steps. Referring to FIG. 3B, in operation 331a lightly doped source (LDS) region having the second type of conductivity (n-type) is implanted before gate spacer formation. FIG. 4D shows the LDS region 421 implanted with the LDD region 423 at the same time. The LDS region 421 and LDD region 423 are implanted with other LDD region and LDS regions of other non-HV transistors on the semiconductor device using one photomask. After implanting the LDS region 421, a gate spacer 425 is formed in operation 313 as described above and shown in FIG. 4E. Referring back to FIG. 3B, in operation 315 a fourth well is implanted as described above and shown in FIG. 4B.

Figure 4G:
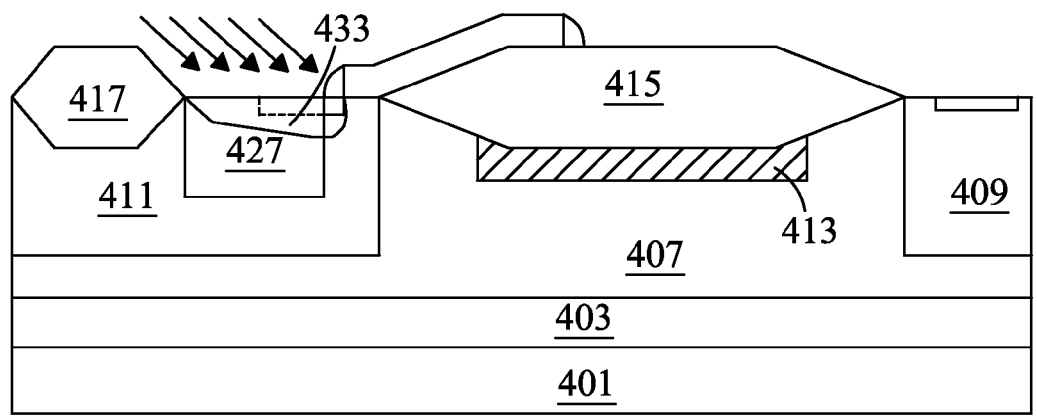

In operation 333, an n-type implantation at an acute angle into the third well below the gate spacer is performed. FIG. 4G shows the angled implantation forming an n-type well 433. The n-well 433 is implanted using a higher dosage than the LDS region so that the n-type dopant concentration under the spacer is increased. Because the LIGBT is curved, the ion beam or the wafer rotates so that the dopants penetrate under the gate spacer from all angles. The angle of implantation may be about 45 degrees or between about 30 degrees and 60 degrees.

Figure 4H:
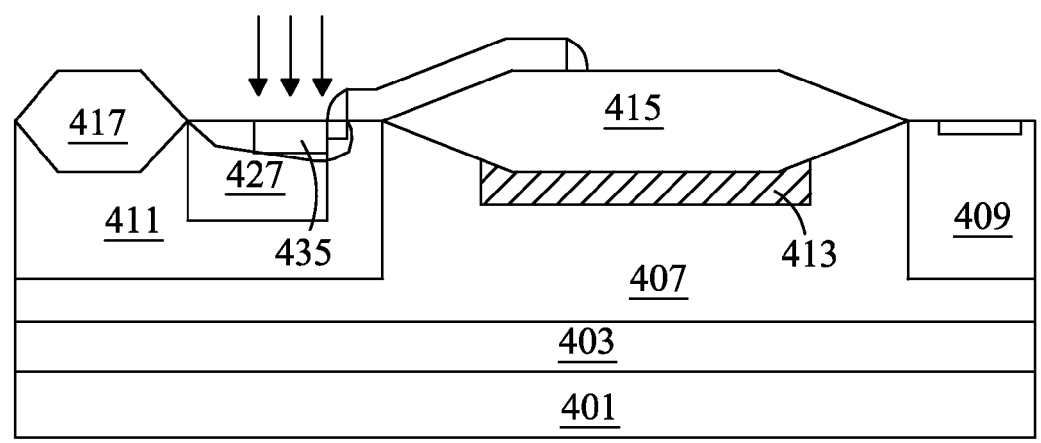

In operation 335, a high dose n-type dopant is implanted at a normal angle into the LDS region. As shown in FIG. 4H, the high dose n-type implantation forms a N+ region 435 in the first source region as described. The N+ region 435 has a higher dopant concentration than the n-well 433 and the LDS region.

According to various embodiments, the operations 315, 333, and 335 may be performed in different orders than described. For example, operation 335 may be performed first, followed by operations 315 and 333 in any order. Further the n-type well 433 may have other shapes depending on the implantation process parameters. In one embodiment, the n-type well 433 may be implanted using the same photomask as N+ region 435.

Figure 4I:
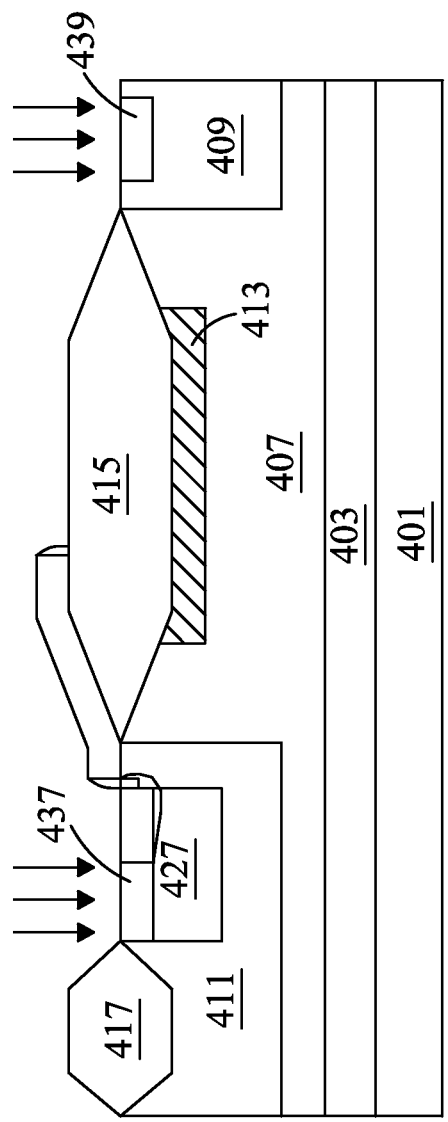

Referring back to FIG. 3A, in operation 317 a second source region is formed over a portion of the fourth well. An implantation process at a high dosage is used to form the second source region. The second source region has a first type conductivity (p-type) at a higher concentration than fourth well 427 and may be referred to as P+ region. FIG. 4I shows the second source region 437 between the first source region and the field oxide 417.

Referring to FIG. 3A, in operation 319 a drain region is formed in the first well region. As shown in FIG. 4I, the drain region 439 is formed directly over the LDD region in the first well 409. The drain region 439 includes a highly doped portion having the first conductivity type. Thus the highly doped portion of the drain region 439 may be formed together with the P+ region of the first source region. In some embodiments, the first well 409 and the drain region 439 are formed in different operations, for example, if different dopant concentrations are used.

Remaining operations for forming the LIGBT transistor include forming contacts over the transistor. As shown in FIG. 2A, contact structures 237, 239, and 241 are formed over various features of the transistor. Contact 241 connects to the drain regions 233. Contact 239 connects to the gate 219. Contact 237 connects to the source structures 231 and 229 singly or together. An interlayer dielectric (ILD) 235 fills the space between the various contacts. After the contacts are formed, the first layer of interconnects is complete after the interconnects are formed.

The interconnects and contacts are formed of conductive materials, such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnects may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The ILD material includes (for example, 235) silicon oxide, fluorinated silica glass, or low dielectric constant (k) materials. In some embodiments, the ILD includes a material having a low dielectric constant, such as a dielectric constant less than about 3.5. In one embodiment, the dielectric layer includes silicon dioxide, silicon nitride, silicon oxynitride, polyimide, spin-on glass (SOG), fluoride-doped silicate glass (FSG), carbon doped silicon oxide, BLACK DIAMOND® (Applied Materials of Santa Clara, Calif.), Xerogel, Aerogel, amorphous fluorinated carbon, Parylene, BCB (bis-benzocyclobutenes), Silk (Dow Chemical, Midland, Mich.), polyimide, and/or other suitable materials. The dielectric layer may be formed by a technique including spin-on, CVD, or other suitable processes.

The contacts and interconnects are usually metal formed in an integrated process such as a damascene process. In a damascene process, a metal such as copper is used as conductive material for interconnection. Another metal or metal alloy may be additionally or alternatively used for various conductive features. During the damascene process, a trench is formed in a dielectric layer, and copper is filled in the trench. Chemical mechanical polishing (CMP) technique is implemented afterward to etch back and planarize the substrate surface.

In some embodiments, a method is disclosed according to FIG. 3A and corresponding intermediate cross sections of FIGS. 4A to 4F and 4I. In certain embodiments, a subset of the operations (310) of FIG. 3A is replaced with the operations of FIG. 3B that discloses a method corresponding to intermediate cross sections of FIGS. 4A to 4I.

Figure 5:
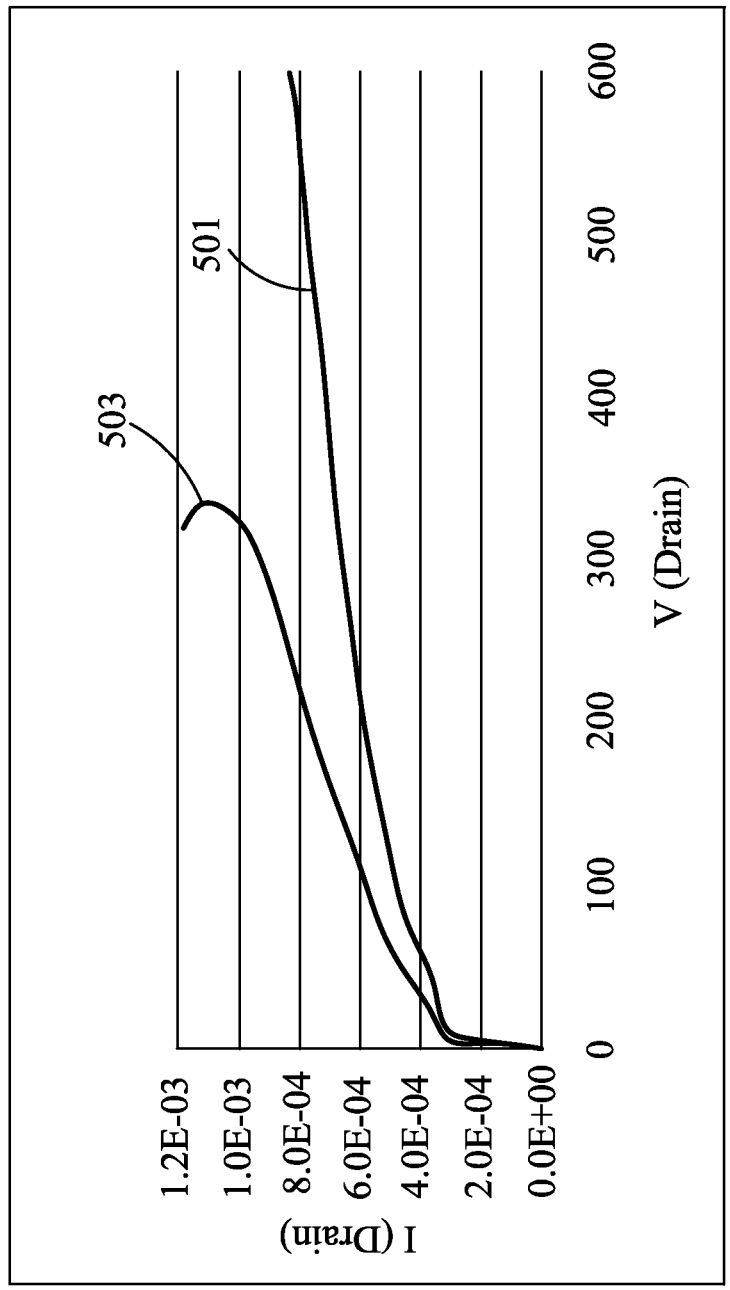
FIG. 5 is a charts of the on-state currents of a comparative HV LIGBT and an HV LIGBT embodiment of the present disclosure.

FIG. 5 is a chart of the transistor on-state current as a function of drain voltage during transistor on-state modeled using a comparative HV LIGBT and an HV LIGBT in accordance with various embodiments of the present disclosure. Line 501 corresponds to an HV LIGBT in accordance with various embodiments of the present disclosure. Line 503 corresponds to a comparative HV LIGBT of FIG. 1B without the improved low-impedance path and additional doping under the gate spacer.

At very low drain voltages, the two transistors behave similarly with increases in current. However, the current for the comparative LIGBT (line 503) increases faster than the LIGBT (line 501) of present disclosure throughout a high voltage operation range. The comparative LIGBT burns out at about 320 volts at the drain, likely due to overheating in the hole current path and causing a short circuit in the LIGBT. The LIGBT of line 501 responds with increased current with increasing drain voltage to 600 volts. FIG. 5 shows that the LIGBT embodiments of the present disclosure increases a high voltage operation range.

Figure 6A:
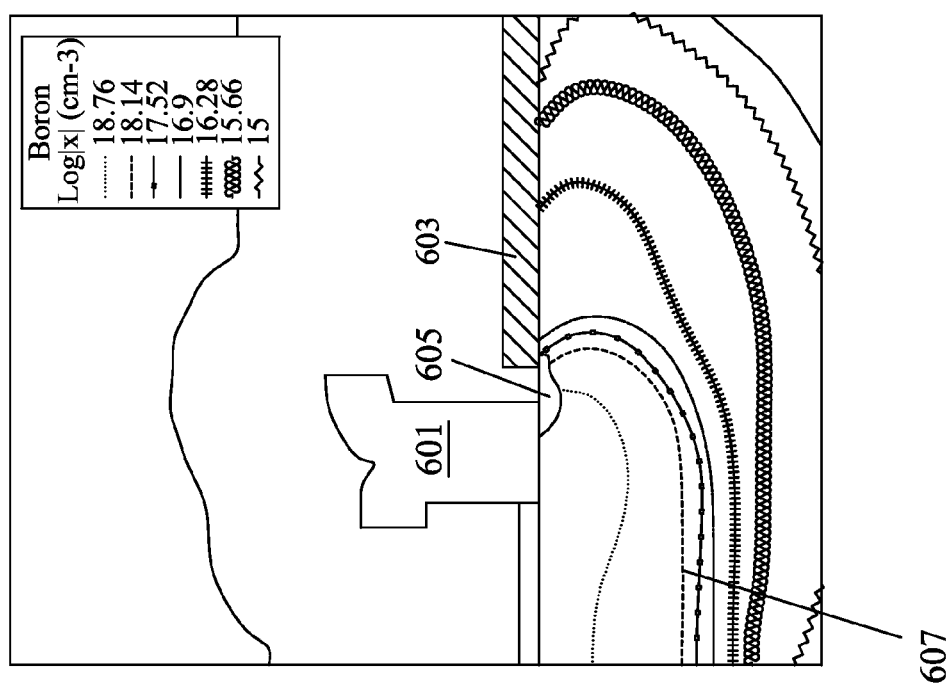
FIGS. 6A and 6B are charts of boron concentration profiles for the comparative HV LIGBT and an HV LIGBT embodiment of the present disclosure.
Figure 6B:
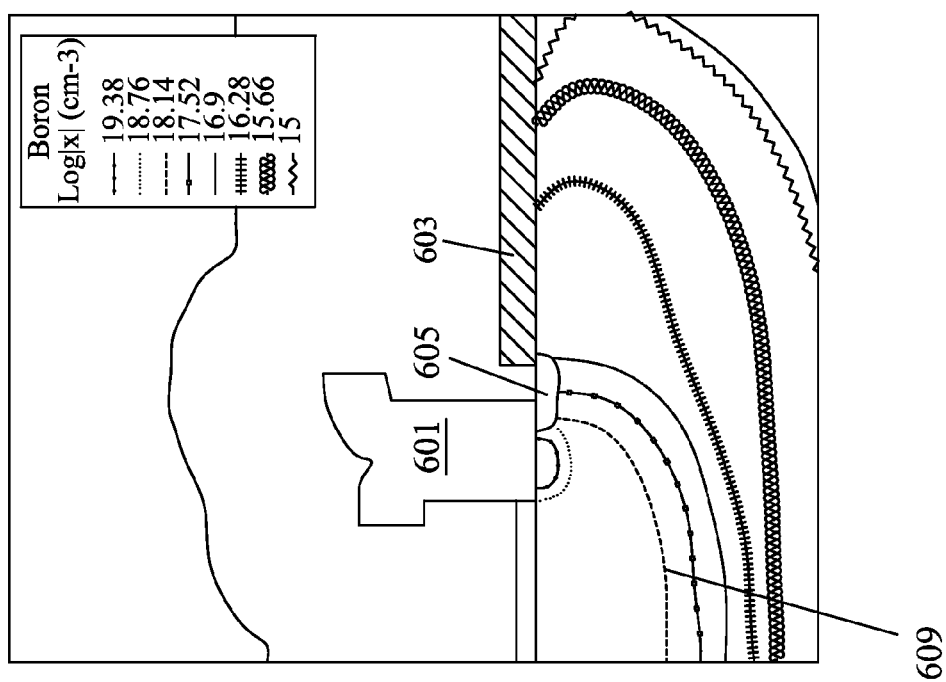

FIGS. 6A and 6B are charts of boron concentration gradients according to the method embodiments. FIG. 6A corresponds to an LIGBT formed using the various process embodiments as described. FIG. 6B corresponds to an LIGBT of FIG. 1B. The boron concentration gradients are shown on a logarithmic scale of dopants/cm$^3$. The boron concentration is a proxy for hole path impedance. In other words, high boron concentration indicates a lower hole current impedance. A higher boron concentration along the parasitic BJT current path, particularly just below the source region and contact, would reduce the parasitic BJT impedance. In FIGS. 6A and 6B, the Y shaped contact 601 is the source contact. A gate 603 is located next to the source contact 601. Below and between the source contact 601 and gate 603 is the N+ region 605 of the source region, marked by a white line. In FIG. 6B, the highest boron concentration, between about E19.38 to E20, occurs below the source contact 601 next to the N+ region 605. A low impedance area is marked by dashed line 609 enclosing boron concentrations greater than E18.14. In FIG. 6A, the highest boron concentration region is more dispersed, and occurs at the N+ region 605 edge and below. A low impedance area is marked by dashed line 607 enclosing boron concentration greater than E18.14. Thus for the hole current, the LIGBT of FIG. 6A has a larger low-impendence area than the LIGBT of FIG. 6B.

In one aspect, the present disclosure pertains to semiconductor devices that include a silicon-on-insulator (SOI) substrate having an insulator layer and a silicon layer over the insulator layer and a transistor region on the SOI substrate. The transistor region includes a drift region having a first type of conductivity over SOI layer, a first well region in the drift region and having the first type of conductivity, and a second well region in the drift well region and having a second type of conductivity. The second type of conductivity is opposite of the first type of conductivity. The transistor region also includes a first insulating structure over and partially embedded in the drift region between the first well region and the second well region, a second insulating structure over and partially embedded in the second well region, a gate structure over the first insulating structure and partially over the second well region, a drain region in the first well region, and a source region in the second well region between the second insulating structure and the gate structure. The source region includes a first source region having a second type of conductivity and a second source region having a first type of conductivity, wherein the second source region is disposed partially under a portion of the gate structure. The source region is disposed over a third well region within the second well region. The third well region has a second type of conductivity at a higher dose than the second well region and is not disposed under the gate structure.

In another aspect, the present disclosure pertains to methods for forming a semiconductor device. The method includes providing a semiconductor substrate having a substrate of first type of conductivity, an insulating layer, and a silicon layer having a second type of conductivity, doping a first well region having the second type of conductivity in the silicon layer, doping a second well region and a third well region having the first type of conductivity in the silicon layer, thermally growing a first insulating layer in and over the second well region between the first well region and the third well region and a second insulating layer in the third well region, forming a gate electrode on the substrate, the gate electrode having a first part overlying the first insulating layer and a second part overlying a portion of the third well region, forming a first source region in the third well region, the first source region having the second type of conductivity, forming a gate spacer around the gate electrode, doping a fourth well region having a first type of conductivity in the third well region between the first insulating layer and the gate spacer, forming a second source region over a portion of the fourth well region, and forming a drain region in the first well region. The second well region and the third well region have different peak dopant concentrations and being non-overlapping with each other and the first well region. A second part overlying a portion of the third well region.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, while the novel LIGBT is discussed having a first conductivity type as the p-type, the conductivity types may be switched. While various embodiments involved various process steps on an SOI substrate, another substrate with proper isolation may be used. For example, a p-type substrate with a buried oxide layer and various isolation trenches may be used.

What is claimed is:

1. A semiconductor device comprising:
   a semiconductor substrate having an insulator layer and a silicon layer over the insulator layer; and
   a transistor region over the semiconductor substrate, the transistor region comprising:
      a drift region having a first type of conductivity over the insulator layer;
      a first well in the drift region and having the first type of conductivity;
      a second well in the drift region and having a second type of conductivity, the second type of conductivity being opposite the first type of conductivity;
      a first insulating structure over and partially embedded in the drift region between the first well and the second well;
      a second insulating structure over and partially embedded in the second well;
      a gate structure over the first insulating structure and partially over the second well;
      a drain region in the first well;
      a source region in the second well between the second insulating structure and the gate structure, the source region including a first source region having the second type of conductivity and a second source region having the first type of conductivity, wherein the second source region comprises a first portion directly under the gate structure and having a first dopant concentration, and a second portion not directly under the gate structure and having a second dopant concentration, the first dopant concentration being lower than the second dopant concentration; and
      a third well within the second well and disposed under the source region and aligned with the second portion of the second source region, the third well having the second type of conductivity at a dopant concentration higher than a dopant concentration of the second well.

2. The semiconductor device of claim 1, wherein the first type of conductivity is n-type and the first dopant concentration is higher than an n-type dopant concentration of a lightly doped drain (LDD) region in a low voltage transistor region on the SOI substrate.

3. The semiconductor device of claim 1, wherein the third well comprises a low impedance area under the second source region.

4. The semiconductor device of claim 1, further comprising a ring well under the first insulating structure having the second type of conductivity.

5. The semiconductor device of claim 1, wherein each of the second well, the first insulating structure, the second insulating structure, the gate structure, and the source region has a curved shape in a top view.

6. The semiconductor device of claim 5, wherein the curved shape forms an oval.

7. The semiconductor device of claim 1, wherein the second source region is disposed partially under a gate spacer.

8. The semiconductor device of claim 1, wherein the gate structure comprises a gate dielectric, and the gate dielectric comprises silicon oxide or a high-K dielectric material.

9. The semiconductor device of claim 8, wherein the second source region is further disposed partially under the gate dielectric.

10. The semiconductor device of claim 1, wherein the semiconductor substrate is p-type and the silicon layer is n-type.

11. A semiconductor device comprising:
    a semiconductor substrate having an insulator layer and a silicon layer over the insulator layer; and
    a transistor region over the semiconductor substrate, the transistor region comprising:
       a drift region having a first type of conductivity over the insulator layer;
       a first well in the drift region and having the first type of conductivity;
       a second well in the drift region and having a second type of conductivity, the second type of conductivity being opposite the first type of conductivity;
       a third well in the drift region and having the second type of conductivity;
       a first insulating structure over and partially embedded in the second well between the first well and the third well;
       a second insulating structure over and partially embedded in the third well;
       a gate structure over the first insulating structure and partially over the third well;
       a drain region in the first well;
       a source region in the third well between the second insulating structure and the gate structure, the source region including a first source region having the second type of conductivity and a second source region having the first type of conductivity, wherein the second source region comprises a first portion directly under the gate structure and having a first dopant concentration, and a second portion not directly under the gate structure and having a second dopant concentration, the first dopant concentration being lower than the second dopant concentration; and
       a fourth well within the third well disposed under the source region and aligned with the second portion of the second source region, the fourth well having the second type of conductivity at a dopant concentration higher than a dopant concentration of the third well.

12. The semiconductor device of claim 11, wherein the fourth well comprises a low impedance area under the second source region.

13. The semiconductor device of claim 11, wherein each of the second well, the third well, the first insulating structure, the second insulating structure, the gate structure, and the source region forms an oval in a top view.

14. The semiconductor device of claim 11, wherein the second source region is disposed partially under a gate spacer.

15. The semiconductor device of claim 11, wherein the gate structure comprises a gate dielectric, and the second source region is further disposed partially under the gate dielectric.

16. A device comprising:
   a first well having a first type of conductivity;
   an insulating structure over and partially embedded in the first well;
   a second well having a second type of conductivity in the first well adjacent to one end of the insulating structure, the second type of conductivity being opposite the first type of conductivity;
   a gate structure over the insulating structure and partially over the second well;
   a source region in the second well, the source region comprising:
      a first source region having the second type of conductivity; and
      a second source region between the first source region and the insulating structure and having the first type of conductivity, the second source region comprising a first portion directly under the gate structure and having a first dopant concentration, and a second portion not directly under the gate structure and having a second dopant concentration, the first dopant concentration being lower than the second dopant concentration; and
   a third well having the second type of conductivity in the second well and under the source region and aligned with the second portion of the second source region.

17. The device of claim 16, wherein the third well comprises a low impedance area under the second source region.

18. The device of claim 16, wherein each of the second well, the insulating structure, the gate structure, and the source region forms an oval around a drain region in a top view.

19. The device of claim 16, wherein the second source region is disposed partially under a gate spacer.

20. The device of claim 16 wherein the gate structure comprises a gate dielectric, and the second source region is further disposed partially under the gate dielectric.

* * * * *